United States Patent
Kim et al.

(10) Patent No.: US 12,065,595 B2
(45) Date of Patent: Aug. 20, 2024

(54) ADHESIVE SHEET FOR TEMPORARY ATTACHMENT AND METHOD FOR PRODUCING SEMICONDUCTOR DEVICE USING THE SAME

(71) Applicant: LG CHEM, LTD., Seoul (KR)

(72) Inventors: Sera Kim, Daejeon (KR); Ji Ho Han, Daejeon (KR); Mi Jang, Daejeon (KR); Kwang Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 735 days.

(21) Appl. No.: 16/966,696

(22) PCT Filed: Apr. 11, 2019

(86) PCT No.: PCT/KR2019/004372
§ 371 (c)(1),
(2) Date: Jul. 31, 2020

(87) PCT Pub. No.: WO2019/199085
PCT Pub. Date: Oct. 17, 2019

(65) Prior Publication Data
US 2021/0032501 A1 Feb. 4, 2021

(30) Foreign Application Priority Data

Apr. 12, 2018 (KR) .................. 10-2018-0042889
Mar. 26, 2019 (KR) .................. 10-2019-0034620

(51) Int. Cl.
| | | |
|---|---|---|
| C09J 7/32 | (2018.01) | |
| C09J 7/24 | (2018.01) | |
| C09J 7/25 | (2018.01) | |
| C09J 7/40 | (2018.01) | |
| C09J 133/14 | (2006.01) | |
| H01L 21/683 | (2006.01) | |
| C08K 5/29 | (2006.01) | |
| C08K 5/5397 | (2006.01) | |

(52) U.S. Cl.
CPC ............. *C09J 7/243* (2018.01); *C09J 7/255* (2018.01); *C09J 7/40* (2018.01); *C09J 133/14* (2013.01); *H01L 21/6836* (2013.01); *C08K 5/29* (2013.01); *C08K 5/5397* (2013.01); *C09J 2301/208* (2020.08); *C09J 2301/408* (2020.08); *C09J 2301/416* (2020.08); *H01L 2221/68327* (2013.01); *H01L 2221/68386* (2013.01); *Y10T 428/14* (2015.01); *Y10T 428/1476* (2015.01); *Y10T 428/2809* (2015.01); *Y10T 428/2848* (2015.01); *Y10T 428/2891* (2015.01)

(58) Field of Classification Search
None
See application file for complete search history.

(56) References Cited

U.S. PATENT DOCUMENTS

| | | | | |
|---|---|---|---|---|
| 5,128,386 | A * | 7/1992 | Rehmer | C08F 220/58 525/218 |
| 2004/0235978 | A1* | 11/2004 | Husemann | C09J 133/04 522/83 |
| 2005/0187346 | A1* | 8/2005 | Husemann | C08F 293/005 524/556 |
| 2007/0241436 | A1 | 10/2007 | Ookubo et al. | |
| 2008/0280149 | A1 | 5/2008 | Higuchi et al. | |
| 2008/0138618 | A1* | 6/2008 | Sasaki | C09J 139/06 522/182 |
| 2010/0233868 | A1 | 9/2010 | Maeda et al. | |
| 2011/0053346 | A1 | 3/2011 | Matsumura et al. | |
| 2012/0302041 | A1 | 11/2012 | Maeda et al. | |
| 2014/0120345 | A1 | 5/2014 | Liu et al. | |
| 2015/0010766 | A1 | 1/2015 | Hwang et al. | |
| 2016/0168298 | A1 | 6/2016 | Woods et al. | |
| 2016/0333225 | A1* | 11/2016 | Enoki | H01L 21/6836 |
| 2017/0007362 | A1* | 1/2017 | Chen | B33Y 80/00 |
| 2021/0155831 | A1* | 5/2021 | Jang | C09D 133/066 |
| 2021/0171802 | A1 | 6/2021 | Kim et al. | |

FOREIGN PATENT DOCUMENTS

| | | |
|---|---|---|
| CN | 101911260 A | 12/2010 |
| CN | 107207653 A | 9/2017 |
| CN | 110922515 A | 3/2020 |
| CN | 111225963 A | 6/2020 |
| JP | 09111200 A * | 4/1997 |
| JP | 2000-086984 A | 3/2000 |
| JP | 2005-023205 A | 1/2005 |
| JP | 2009-242733 A | 10/2009 |
| JP | 2010-215769 A | 9/2010 |
| JP | 2012-052031 A | 3/2012 |

(Continued)

OTHER PUBLICATIONS

Product datasheet "Ebecryl P 36", ChemicalBook, retrieved on Mar. 16, 2023 (Year: 2023).*
Kim Eun Yeong et al., "Surface Protecting Adhesive Film For Semiconductor Wafer", machine translation of KR20170109390A, Sep. 29, 2023 (Year: 2017).*
Sunao, Nakazaki et al., "Adhesive Tape for Wafer Adhesion", English translation of JP 9-111200, Apr. 28, 1997 (Year: 1997).*
English translation of Japanese patent application publication No. 09-111200, published Apr. 28, 1997 (Year: 1997).*

*Primary Examiner* — Anish P Desai
(74) *Attorney, Agent, or Firm* — ROTHWELL, FIGG, ERNST & MANBECK, P.C.

(57) ABSTRACT

The present disclosure relates to an adhesive sheet for temporary attachment which is excellent in heat resistance and can realize sufficient adhesive strength even when being subjected to a high temperature process during the semiconductor production process, and can exhibit a sufficient reduction in adhesive strength due to photocuring in a peeling step, and a method for producing a semiconductor device using the same.

9 Claims, 2 Drawing Sheets

(56) References Cited

FOREIGN PATENT DOCUMENTS

| | | | |
|---|---|---|---|
| JP | 2014-158031 | A | 8/2014 |
| JP | 2015-005598 | A | 1/2015 |
| KR | 10-2007-0011540 | A | 1/2007 |
| KR | 10-2008-0099160 | A | 11/2008 |
| KR | 10-2010-0135568 | A | 12/2010 |
| KR | 10-2012-0087068 | A | 8/2012 |
| KR | 10-2014-0139212 | A | 12/2014 |
| KR | 10-2016-0111385 | A | 9/2016 |
| KR | 10-2017-0109390 | A | 9/2017 |
| TW | 201444938 | A | 12/2014 |
| TW | 201602296 | A | 1/2016 |
| WO | 2014-157306 | A1 | 10/2014 |
| WO | 2015-146312 | A1 | 10/2015 |

\* cited by examiner

[FIG. 1]
(a)
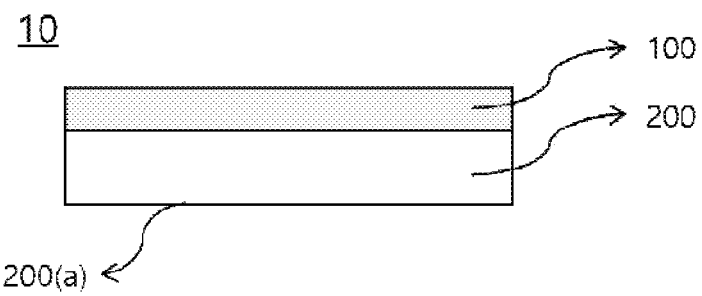
(b)
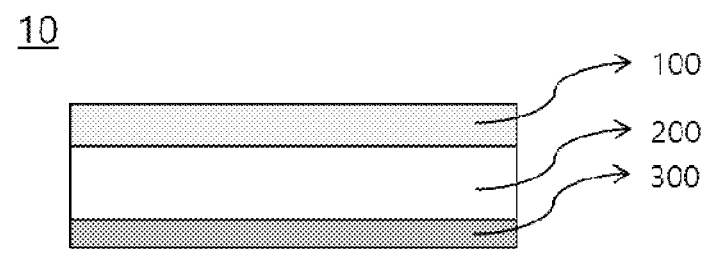

[FIG. 2]
(a)
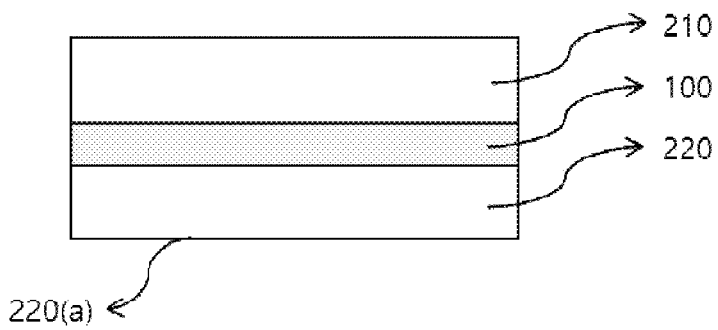
(b)
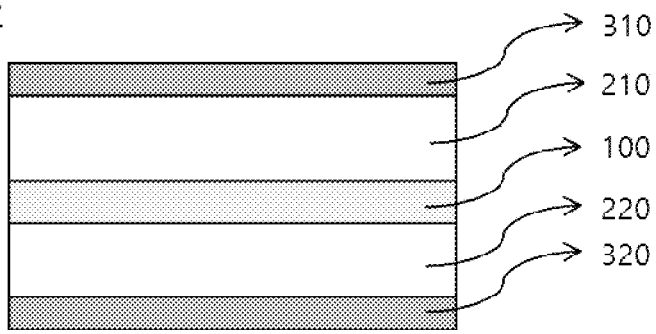

ADHESIVE SHEET FOR TEMPORARY ATTACHMENT AND METHOD FOR PRODUCING SEMICONDUCTOR DEVICE USING THE SAME

CROSS-REFERENCE TO RELATED APPLICATION(S)

This application is a 35 U.S.C. 371 National Phase Entry Application from PCT/KR2019/004372 filed on Apr. 11, 2019, designating the United States, which claims the benefits of the filing dates of Korean Patent Application No. 10-2018-0042889 filed with the Korean Intellectual Property Office on Apr. 12, 2018, and Korean Patent Application No. 10-2019-0034620 filed with the Korean Intellectual Property Office on Mar. 26, 2019, the entire contents of which are incorporated herein by reference.

TECHNICAL FIELD

The present disclosure relates to an adhesive sheet for temporary attachment and a method for producing a semiconductor device using the same.

BACKGROUND OF THE INVENTION

Recently, the tendency toward miniaturization, thinning, and higher capacity of electronic devices has expanded, and the need for higher density and high integration of semiconductor packages has rapidly increased.

To reflect this, the size of the semiconductor chips is gradually increasing and at the same time the thickness of the chip is becoming thinner.

Thin semiconductor chips have a problem that handing during the production process is difficult. Thus, a method of temporarily attaching a thin semiconductor chip using an adhesive sheet or the like, processing, treating, and transporting the semiconductor chip in a temporarily attached state is applied.

However, since a plurality of processes are performed under high temperature conditions in the semiconductor production process, high heat resistance of the adhesive sheet is required so that problems such as a reduction in adhesive strength does not occur during the process.

In addition, in the step of separating the attached thin semiconductor chips after the completion of a series of steps, sufficient peel force is also required so that no residue or the like remains on the surface such that the semiconductor chip is not damaged.

Recently, as a temporary adhesive material, an ultraviolet-curable adhesive whose adhesive strength is reduced by ultraviolet irradiation is used.

However, in the case of conventional adhesives, there has been a problem in that additives such as photoinitiators in the adhesive are thermally decomposed in a high temperature process, or a reduction in adhesion strength in a peeling stage is insufficient due to the migration phenomenon of additives.

Therefore, in order for an adhesive sheet to be used for temporary attachment, it is necessary to develop an adhesive sheet capable of satisfying all of the adhesive strength, the heat resistance, and the peel force at excellent levels.

BRIEF DESCRIPTION OF THE INVENTION

The present disclosure provides an adhesive sheet for temporary attachment which is excellent in heat resistance and can realize sufficient adhesive strength even when being subjected to a high temperature process during the process of producing a semiconductor, and can exhibit a sufficient reduction in adhesive strength due to photocuring in a peeling step.

The present disclosure also provides a method for producing a semiconductor device using the above-mentioned adhesive sheet for temporary attachment.

According to one aspect of the present disclosure, an adhesive sheet for temporary attachment is provided, including: a substrate film having an elongation in the machine direction (MD) of 200% or more when stretched at a rate of 300 mm/min at 23° C.; and an adhesive layer containing a binder resin having a photoreactive functional group, a photoinitiator having activity at a wavelength of 300 nm or more, and a multifunctional crosslinking agent, wherein a ratio of adhesive strength (A2) measured after irradiating a heat-treated adhesive layer with light relative to an initial adhesive strength (A1) measured after heat treating the adhesive layer at a temperature of 90° C. to 150° C. is 30% or less.

According to another aspect of the present disclosure, a method for producing a semiconductor device is provided, including the steps of: attaching an adhesive layer of the adhesive sheet for temporary attachment to a predetermined portion of the semiconductor device; subjecting the semiconductor device to which the adhesive sheet is attached to a predetermined process; irradiating the substrate film of the adhesive sheet for temporary attachment with ultraviolet light after the predetermined process; and detaching the adhesive sheet for temporary attachment from the semiconductor device.

DETAILED DESCRIPTION OF THE INVENTION

Hereinafter, the adhesive sheet for temporary attachment and the method for producing a semiconductor device using the same according to embodiments of the present disclosure will be described in detail.

Unless otherwise specified throughout this specification, technical terms used herein are only for describing specific embodiments and are not intended to limit the present disclosure.

The singular forms "a," "an," and "the" are intended to include plural forms, unless the context clearly indicates otherwise.

The term "including" or "comprising" used herein specifies a specific feature, region, integer, step, action, element, and/or component, but does not exclude the presence or addition of a different specific feature, area, integer, step, action, element, component, and/or group.

Terms including ordinal numbers such as "a first", "a second", etc. are used only for the purpose of distinguishing one component from another component, and are not limited by the ordinal numbers.

For instance, a first component may be referred to as a second component, and similarly, the second component may be referred to as the first component, without departing from the scope of the present disclosure.

As a result of further studies by the present inventors, it has been found that in the adhesive sheet for temporary attachment for use in a semiconductor production process, a substrate film is formed from a heat-resistant polymer having excellent stretching properties and ultraviolet transmittance, and an adhesive layer is formed as a specific component capable of initiating photopolymerization in the transmitting wavelength region of the substrate film, thereby realizing excellent adhesive strength during the semiconductor production process, and exhibiting a sufficient adhesive strength-reducing effect due to photocuring in a peeling step even when being subjected to a high temperature process.

Thus, it has been found that the efficiency of the semiconductor production process is improved and the quality of the produced semiconductor is excellent.

I. Adhesive Sheet for Temporary Attachment

According to an embodiment of the present invention, an adhesive sheet for temporary attachment is provided, including a substrate film and an adhesive layer, wherein a ratio of adhesive strength (A2) measured after irradiating a heat-treated adhesive layer with light relative to initial adhesive strength (A1) measured after heat treating the adhesive layer at a temperature of 90° C. to 150° C. is 30% or less.

Preferably, the ratio (R) of the adhesive strength (A2) measured after irradiating a heat-treated adhesive layer with light relative to an initial adhesive strength (A1) measured after heat treating the adhesive layer at a temperature of 90° C. to 150° C. may be defined as the following General Formula 1.

$$R(\%) = A2'*100/A1'$$ [General Formula 1]

In General Formula 1, A1' is the adhesive strength of the adhesive layer measured after heat treatment at 100° C. for 3 hours, and A2' is the adhesive strength of the adhesive layer measured after irradiating the heat-treated adhesive layer with ultraviolet light in the composite wavelength region of 200 nm to 500 nm at an intensity of 100 mJ/cm$^2$ to 1000 mJ/cm$^2$.

The adhesive strength ratio (R) of the adhesive layer is an index for realizing excellent adhesive strength even under high temperature conditions in the process of producing a semiconductor and exhibiting a sufficient adhesive strength-reducing effect due to photocuring in a peeling step. As the adhesive sheet for temporary attachment according to the present disclosure satisfies the above-mentioned. value of the adhesive strength ratio (R) of 30% or less, it can be applied to the semiconductor production process, thereby remarkably improving the efficiency of the process and producing a high-quality semiconductor.

The adhesive strength ratio R can be derived by adjusting the material of the adhesive layer, the process conditions of the adhesive layer, and the like.

In the present disclosure, when the adhesive strength ratio R is more than 30%, a sufficient peeling force effect due to photocuring can not be realized. In this case, there are problems that adhesion residues may be present on the surface of the target semiconductor, or it may induce damage to the semiconductor.

Preferably, the above-mentioned rate of change may be 20% or less, preferably 15% or less, and more preferably 10% or less.

Substrate Film

The substrate film according to an embodiment of the present disclosure does not cause deterioration or deformation under high temperature conditions in the process of producing a semiconductor, and it is a material having an elongation of 200% or more which is excellent in stretching property and thus can be easily applied to a pickup process.

In the present disclosure, the substrate film satisfies an elongation in the machine direction (MD) of 200% or more when stretched at a rate of 300 mm/min at 23° C. When the elongation is less than 200%, the success rate of the pickup process may be significantly reduced.

In the present disclosure, the elongation of the substrate film may preferably satisfy 250% or more, and more preferably 300% or more.

In the present disclosure, the substrate film may include one or more polymer compounds selected from the group consisting of a polyolefin, a polyester, a polycarbonate, a polyvinyl chloride, a polytetrafluoroethylene, a polybutene, a polybutadiene, an ethylene-vinyl acetate copolymer, an ethylene-propylene copolymer, and an ethylene-alkyl acrylate copolymer, as well as a polybutylene terephthalate.

Preferably, the substrate film may include polyolefin, or polybutylene terephthalate.

In the present disclosure, when the substrate film contains a mixture of two or more polymers, it includes both a film having a structure in which films each containing the above-mentioned polymers are laminated into two or more layers, and a single-layer film containing two or more of the above-mentioned polymers.

In addition, the substrate film contains the above-mentioned heat-resistant polymer components, and at the same time, satisfies transmittance of 50% or more at a wavelength of 300 nm or more, thereby allowing the photoinitiator in the adhesive layer described below to easily initiate the photopolymerization reaction.

When the substrate film has transmittance of less than 50% at a wavelength of 300 nm or more, the light absorption of the photoinitiator of the adhesive layer is insufficient and thus the reduction of the adhesive strength may not be sufficient in a step of separating the adhesive sheet.

The thickness of the substrate film is not particularly limited, and can be generally formed to a thickness of 5 to 500 μm, and preferably, it can be formed to a thickness of 10 to 300 μm or 50 to 100 μm.

In this case, it can be supported in the high temperature process of the semiconductor, and it can be peeled off without damage in the peeling step of the adhesive sheet.

The substrate film may be subjected to an additional treatment for improving performance within a range not affecting the effects intended by the present disclosure.

For example, conventional physical treatment or chemical treatment such as matte treatment, corona discharge treatment, primer treatment, and crosslinking treatment may be performed to a surface of the substrate film.

Adhesive Layer

The adhesive layer according to one embodiment of the present disclosure may be formed on one surface of the substrate film, and is formed of a specific material satisfying the above-described adhesion strength ratio (R).

According to the present disclosure, the adhesive layer is formed of a material which realizes excellent adhesive strength due to heat, and exhibits an excellent adhesive strength-reducing effect by ultraviolet irradiation. In particular, by using a binder resin having a photoreactive functional group in combination with a specific photoinitiator, even when a wavelength is transmitted from the substrate film at a relatively low transmittance, it is possible to realize excellent photoinitiating efficiency and an excellent adhesive strength-reducing effect even after a high temperature process.

According to the present disclosure, since the adhesive layer includes an adhesive layer containing a binder resin having a photoreactive functional group and a photoinitiator having activity at a wavelength of 300 nm or more, the combination of the above-mentioned components can realize sufficient adhesive strength during the semiconductor production process even under high temperature conditions, and can easily lower the adhesive strength due to photocuring in the peeling step.

According to the present disclosure, the adhesive layer may be formed by using a composition for forming an adhesive layer containing the above-mentioned components.

In the present disclosure, the binder resin having a photoreactive functional group includes two or more types of acrylic repeating units that are different from each other, and according to the specific graft copolymer structure, excellent adhesive stability can be achieved even in a high temperature process.

In the present disclosure, the benzoylphenyl group of the first (meth)acrylate repeating unit generates radicals by ultraviolet irradiation to initiate a curing reaction, and makes it possible to realize a stable adhesive strength-reducing effect even after a high temperature process.

The benzoylphenyl group may mean a functional group represented by the following Chemical Formula 1.

[Chemical Formula 1]

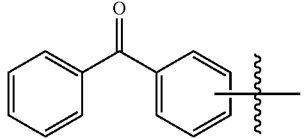

One or more benzoylphenyl groups may be substituted in the first (meth)acrylate-based repeating unit.

The first (meth)acrylate-based repeating unit may be derived from a monomer obtained by the addition reaction of a compound having a benzoylphenyl group and a (meth)acrylate-based compound.

Specific examples thereof include benzoylphenyl methyl (meth)acrylate, benzoylphenyl ethyl(meth)acrylate, benzoylphenyl n-propyl(meth)acrylate, benzoylphenyl isopropyl (meth)acrylate, benzoylphenyl n-butyl(meth)acrylate, benzoylphenyl t-butyl(meth)acrylate, benzoylphenyl sec-butyl(meth)acrylate, benzoylphenyl pentyl(meth)acrylate, benzoylphenyl 2-ethylhexyl(meth)acrylate, benzoylphenyl 2-ethylbutyl(meth)acrylate, benzoylphenyl n-octyl(meth)acrylate, benzoylphenyl isooctyl(meth)acrylate, benzoylphenyl isononyl(meth)acrylate, and the like, but are not limited thereto.

In the present disclosure, the second (meth)acrylate-based repeating unit may implement a crosslinked structure due to a structure such as a hydroxyl group, a carboxyl group, and a nitrogen-containing functional group, and thereby the cohesive force of the adhesive is improved through the three-dimensional crosslinked structure, and sufficient adhesive strength can be exhibited during the semiconductor production process.

One or more of the hydroxyl group, the carboxyl group, and the nitrogen-containing functional group may be substituted in the second (meth)acrylate-based repeating unit.

The second (meth) acrylate-based repeating unit may be derived from a (meth) acrylate-based monomer containing a hydroxy group, and examples of such monomers include 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 2-hydroxyethylene glycol(meth)acrylate, 2-hydroxypropylene glycol(meth)acrylate, and the like.

The second (meth)acrylate-based repeating unit may be derived from a (meth)acrylate-based monomer containing a carboxyl group, and examples of such monomers include (meth)acrylic acid, crotonic acid, maleic acid, fumaric acid, and the like.

The second (meth)acrylate-based repeating unit may be derived from a (meth)acrylate-based monomer containing a nitrogen-containing functional group, and examples of such monomers include (meth)acrylonitrile, N-vinylpyrrolidone, N-vinylcaprolactam, or the like.

According to the present disclosure, 20 to 95 mol % of the second (meth)acrylate-based repeating unit may include a photopolymerizable (meth)acrylate-based side chain.

The photopolymerizable (meth)acrylate-based side chain may be derived from a photopolymerizable compound capable of binding with a hydroxyl group, a carboxyl group, and a nitrogen-containing functional group of the second (meth)acrylate-based repeating unit, and specifically, it may be derived from a compound having an isocyanate group or an epoxy group.

Specific examples of the photopolymerizable compound include compounds capable of reacting with a hydroxyl group, such as (meth)acryloyloxy isocyanate, (meth)acryloyloxy methyl isocyanate, 2-(meth)acryloyloxy ethyl isocyanate,3-(meth)acryloyloxy propyl isocyanate, 4-(meth) acryloyloxy butyl isocyanate, m-propenyl-α,α-dimethylbenzyl isocyanate, methacryloyl isocyanate, or allyl isocyanate; an acryloyl monoisocyanate compound obtained by reacting a diisocyanate compound or a polyisocyanate compound with 2-hydroxyethyl(meth)acrylate; an acryloyl monoisocyanate compound obtained by reacting a diisocyanate compound or a polyisocyanate compound with a polyol compound and 2-hydroxyethyl(meth)acrylate; and the like.

In addition, as the compound capable of reacting with the carboxyl group, one or more selected from glycidyl(meth)acrylate, allyl glycidyl ether, etc. may be mentioned, without being limited thereto.

When the photopolymerizable (meth)acrylate-based side chain is substituted with less than 20 mol % of the second (meth)acrylate repeating unit, there is a possibility that a reduction in peel force due to ultraviolet irradiation is not sufficient, and when it is substituted by more than 95 mol % of the second (meth)acrylate repeating unit, there is a possibility that the cohesive force of the adhesive before ultraviolet irradiation is lowered.

In the present disclosure, the binder resin having a photoreactive functional group may further include an additional (meth)acrylate-based repeating unit, in addition to the above-mentioned first (meth)acrylate-based repeating unit and second (meth)acrylate-based repeating unit.

For example, as the repeating unit not containing a specific functional group as described above, there may be a repeating unit derived from an aliphatic (meth)acrylate, an alicyclic (meth)acrylate, an aromatic (meth)acrylate, or the like.

The aliphatic (meth)acrylate may be an alkyl (meth)acrylate having an alkyl group having 1 to 20 carbon atoms, and specific examples thereof may be methyl(meth)acrylate, ethyl(meth)acrylate, n-propyl(meth)acrylate, isopropyl (meth)acrylate, n-butyl(meth)acrylate, t-butyl(meth)acrylate, sec-butyl(meth)acrylate, pentyl(meth)acrylate, 2-ethylhexyl(meth)acrylate, 2-ethylbutyl(meth)acrylate, n-octyl (meth)acrylate, isooctyl(meth)acrylate, isononyl(meth)acrylate, and the like.

The alicyclic (meth)acrylate may be a cycloalkyl (meth)acrylate having a cycloalkyl group having 3 to 30 carbon atoms, or the like, and specific examples thereof may be isobornyl acrylate (IBOA), trimethyl cyclohexyl acrylate, cyclopentyl(meth)acrylate, cyclohexyl(meth)acrylate, dicyclopentanyl methacrylate, dicyclopentenyl methacrylate, dicyclopentenyloxy methacrylate, and the like.

The aromatic (meth)acrylate may be an alkyl (meth)acrylate having an aromatic group having 6 to 30 carbon atoms, and specific examples thereof may be phenyl hydroxypropyl(meth)acrylate, o-phenylphenol EO (meth)acrylate, 2-hydroxy-3-phenylphenoxypropyl (meth)acrylate, phenol EO (meth)acrylate, and the like.

In the present disclosure, the binder resin having the photoreactive functional group may have a weight average molecular weight of 100,000 to 30,000,000 g/mol, and preferably 400,000 to 2,000,000 g/mol.

When the binder resin has a weight average molecular weight in the above range, it exhibits proper coating properties and cohesive force, and thus problems such as leaving a residue on the adherend in a peeling step do not occur, which is preferable.

In the present disclosure, the photoinitiator is a component having activity at a wavelength of 300 nm or more, and is a component that initiates photopolymerization at the wavelength transmitted from the substrate film described above to easily lower the adhesive strength of the adhesive layer.

In the present disclosure, the photoinitiator is a component having activity at a wavelength of 300 nm or more, and is a component that initiates photopolymerization at the wavelength transmitted from the above-mentioned substrate film to easily reduce the adhesive strength of the adhesive layer.

Examples of the photoinitiator may be bis(2,4,6-trimethylbenzoyl)-phenylphosphine oxide, 1-hydroxy-cyclohexyl-phenyl-ketone, 2,2-dimethoxy-1,2-diphenylethan-1-one, 2-methyl-1[4-(methylthio)phenyl]-2-morpholinopropane-1-one, oxy-phenyl-acetic acid 2-[2-oxo-2-phenyl-acetoxy-ethoxy]-ethylester, oxy-phenyl-acetic acid 2-[2-hydroxy-ethoxy]-ethylester, 2-benzyl-2-dimethylamino-1-(4-morpholinophenyl)-butan-1-one, 2,4,6-trimethylbenzoyl-diphenyl-phosphine oxide, thioxanthone, etc., and preferably, bis(2,4,6-trimethylbenzoyl)-phenylphosphine oxide can be used.

These may be used alone or in combination of two or more.

When the photoinitiator is formed of the above-described components, the activity due to the ultraviolet light transmitted through the substrate film of the present disclosure is excellent.

In the present disclosure, the photoinitiator may be contained in an amount of 0.1 to 40 parts by weight, preferably 1 to 20 parts by weight, based on 100 parts by weight of the binder resin having the photoreactive functional group. When the photoinitiator is included in the above content range, an effective curing reaction can be induced to prevent deterioration of physical properties and the like caused by the remaining components after curing.

In the present disclosure, the adhesive layer may further include a multifunctional crosslinking agent.

In the present disclosure, the multifunctional crosslinking agent is a component which imparts a cohesive force to the adhesive layer, and examples thereof include one or more compounds selected from the group consisting of an isocyanate-based compound, an aziridine-based compound, an epoxy-based compound, and a metal chelate-based compound.

The isocyanate-based compound, the aziridine-based compound, the epoxy-based compound, and the metal chelate-based compound can be used without particular limitation as long as they are compounds commonly used in the art.

In the present disclosure, the crosslinking agent may be contained in an amount of 0.1 to 30 parts by weight, preferably 1 to 10 parts by weight, based on 100 parts by weight of the binder resin having the photoreactive functional group.

When the amount of the crosslinking agent is less than 0.1 parts by weight, the cohesive force of the adhesive layer may be insufficient, and when the amount of the crosslinking agent is more than 40 parts by weight, the adhesive layer cannot ensure sufficient adhesive strength before photocuring, and thus a peeling phenomenon and the like can occur.

The method of forming the adhesive layer on the substrate film including the components as described above is not particularly limited, and for example, a method of coating the composition for forming an adhesive layer of the present disclosure directly onto a substrate film to form an adhesive layer, or a method of coating a composition for forming an adhesive layer of the present disclosure onto a releasable substrate to form an adhesive layer, and transferring the adhesive layer onto a substrate film using the releasable substrate, or the like can be used.

In this case, the method of coating and drying the adhesive composition for forming an adhesive layer is not particularly limited, and for example, a method of coating a composition containing the respective components as they stand, or diluting the composition in a suitable solvent and coating it by a known means such as a comma coater, a gravure coater, a die coater, or a reverse coater, and then drying the solvent at a temperature of 60° C. to 200° C. for 10 seconds to 30 minutes, can be used.

Further, the above process may further include an aging process for performing a sufficient crosslinking reaction of the adhesive.

The thickness of the adhesive layer is not particularly limited, but for example, the adhesive layer may be usually formed with a thickness of 5 to 100 μm. When the adhesive layer is formed in the above thickness range, it can be supported in the high temperature process of the semiconductor, and can be peeled off without being damaged in the peeling step of the adhesive sheet.

In the present disclosure, a release film formed on the adhesive layer may be further included.

Examples of the release film which can be used include one or more plastic films selected from the group consisting of a polyethylene terephthalate film, a polytetrafluoroethylene film, a polyethylene film, a polypropylene film, a polybutene film, a polybutadiene film, a vinyl chloride copolymer film, a polyimide film, and the like.

The surface of the release film as described above may be subjected to a release treatment with one or more of alkyd-based, silicone-based, fluorine-based, unsaturated ester-based, polyolefin-based, or wax-based release agents. Among them, an alkyd-based, silicone-based, or fluorine-based release agent having heat resistance is particularly preferred.

The release film may be usually formed at a thickness of 10 μm to 500 μm, preferably 20 μm to 200 μm, but it is not limited thereto.

The adhesive sheet for temporary attachment according to the present disclosure can be used as a protective film for semiconductor process, a carrier film, or a film for a pickup process.

In particular, when applied to a film for a pickup process, the pickup success rate of dicing can be remarkably improved due to the excellent stretching property of the substrate film and the low peeling force property of the adhesive layer.

Moreover, the adhesive sheet for temporary attachment according to the present disclosure can include one or more adhesive layers, and thereby, can be formed on one surface or both surfaces of the substrate film.

Further, the method for producing the adhesive sheet for temporary attachment is not particularly limited, and for example, a method of sequentially forming an adhesive layer and a release film (as needed) on a substrate film, or a method of separately producing a release film having an adhesive layer formed on a substrate film and then laminating the release film, or the like can be used.

The laminating method is not particularly limited, and for example, a hot roll laminating method or a laminate pressing method can be used. Among them, in terms of continuous process possibility and efficiency, the hot roll laminating method is preferred.

The hot roll laminating method may be performed at a temperature of 10° C. to 100° C. under a pressure of 0.1 Kgf/cm$^2$ to 10 Kgf/cm$^2$, but is not limited thereto.

FIGS. 1 and 2 show cross-sectional views of an adhesive sheet 10 for temporary attachment according to an embodiment of the present disclosure.

Referring to FIG. 1(a), the adhesive sheet 10 for temporary attachment according to the embodiment of the present disclosure may have a structure in which a substrate film 100 and an adhesive layer 200 are laminated.

When the adhesive sheet 10 is applied to a semiconductor production process, the surface 200(a) of the adhesive layer 200 on which the substrate film 100 is not formed can be attached to a predetermined portion of the semiconductor device.

Referring to FIG. 1(b), the adhesive sheet 10 for temporary attachment according to one embodiment of the present disclosure may have a structure in which a substrate film 100, an adhesive layer 200, and a release film 300 are sequentially laminated.

When the adhesive sheet 10 is applied to a semiconductor production process, the release film 300 is peeled from the adhesive layer 200, and then one surface of the adhesive layer 200 from which the release film 300 is peeled may be attached to a predetermined portion of the semiconductor device.

Referring to FIG. 2(a), the adhesive sheet 10 for temporary attachment according to one embodiment of the present disclosure may have a structure in which adhesive layers 210 and 220 are formed on respective surfaces of the substrate film 100.

In this case, the first adhesive layer 210, the substrate film 100, and the second adhesive layer 220 may be sequentially laminated.

When the adhesive sheet 10 is applied to a semiconductor production process, the surface on which any one substrate film 100 of the adhesive layers is not formed can be attached to a predetermined portion of the semiconductor device.

For example, the surface 220(a) of the second adhesive layer 220 on which the substrate film 100 is not formed can be attached to a predetermined portion of the semiconductor device.

Referring to FIG. 2(b), the adhesive sheet 10 for temporary attachment according to an embodiment of the present disclosure may have a structure in which a first release film 310, a first adhesive layer 210, a base film 100, a second adhesive layer 220, and a second release film 320 may be sequentially laminated.

When the adhesive sheet 10 is applied to a semiconductor production process, the release films 310 and 320 are peeled from the second adhesive layers 210 and 220, and one surface of the adhesive layers 210 and 220 from which the release films 310 and 320 are peeled off may be attached to a predetermined portion of the semiconductor device.

Subsequently, in the peeling step of the adhesive sheet 10, the second adhesive layer 220 can be photo-cured by irradiating the first adhesive layer 210 with ultraviolet light and passing through the lower substrate film 100.

As a result, the adhesive strength of the adhesive layer 200 is lowered, and the adhesive sheet 10 for temporary attachment can be easily peeled off from the semiconductor device.

II. Method for Producing Semiconductor Device

According to another embodiment of the present disclosure, a method for producing a semiconductor device using the above-described adhesive sheet for temporary attachment is provided.

Typically, the process of producing a semiconductor device includes a step which is performed under high temperature conditions, and in this case, there has been a problem that the substrate film and the adhesive layer are thermally decomposed or the additives and the like contained in the adhesive layer are detached.

In this case, sufficient adhesive strength could not be realized during the process of producing the semiconductor, or sufficient reduction in adhesive strength was not realized in the peeling step due to the photocuring of the adhesive sheet.

The adhesive sheet 10 for temporary attachment according to the present disclosure forms a substrate film with a material having UV transparency, or forms an adhesive layer as a specific component capable of improving the initiation and reactivity of photopolymerization in the transmitting wavelength region of the substrate film, thereby improving all the problems mentioned above.

Thus, it has been found that the efficiency of the semiconductor production process is improved and the quality of the produced semiconductor is excellent.

The method for producing a semiconductor device according to another aspect of the present disclosure includes the steps of: attaching an adhesive layer of an adhesive sheet for temporary attachment to a predetermined portion of the semiconductor device; subjecting the semiconductor device to which the adhesive sheet is attached to a predetermined step; irradiating the substrate film of the adhesive sheet for temporary attachment with ultraviolet light after the predetermined process; and detaching the adhesive sheet for temporary attachment from the semiconductor device.

The content related to the adhesive sheet for temporary attachment includes all of the above-mentioned contents, and as the method for producing the semiconductor device, a commonly known production method and the like can be applied without any particular limitation, except for the detailed process conditions described below.

In the method for producing a semiconductor device according to another aspect of the present disclosure, the step of irradiating ultraviolet light is a step of initiating photocuring of the adhesive layer, thereby enabling the adhesive sheet to be easily peeled off from the semiconductor device due to a reduction in adhesive strength of the adhesive layer.

In the method for producing a semiconductor device according to one embodiment of the present disclosure, when the adhesive sheet for temporary attachment further includes a release film, the method may further include peeling the release film from the adhesive layer before attaching the adhesive layer of the adhesive sheet to a predetermined portion of the semiconductor device.

It has been found that, based on the above-described method, the efficiency of the production process of the semiconductor device is improved and the quality of the produced semiconductor is excellent.

Advantageous Effects

The adhesive sheet for temporary attachment according to the present disclosure has appropriate adhesive strength in the semiconductor production process, and can be easily reduced in adhesive strength by photocuring to facilitate peeling after the process is completed.

In addition, the adhesive sheet for temporary attachment according to the present disclosure is excellent in heat resistance, and even when applied to a semiconductor production process and subjected to a high temperature process, the adhesive sheet can exhibit a sufficient reduction in adhesive strength due to photocuring in the peeling step.

In particular, when applied to a film for a pickup process, the pickup success rate of dicing can be greatly improved owing to the excellent stretching property of the substrate film and the low peeling force property of the adhesive layer.

BRIEF DESCRIPTION OF DRAWINGS

FIGS. 1 and 2 schematically show a cross-sectional structure of an adhesive sheet 10 for temporary attachment according to an embodiment of the present disclosure.

DETAILED DESCRIPTION OF THE EMBODIMENTS

Preferred examples are given to facilitate understanding of the invention.

However, these examples are presented for illustrative purposes only, and the scope of the invention is not limited thereto.

Preparation Examples: Preparation of Composition for Forming Adhesive Layer

Preparation Example 1

A monomer mixture consisting of 75 g of 2-ethylhexyl acrylate (2-EHA), 5 g of 4-benzoylphenylmethacrylate, and 20 g of hydroxyethyl acrylate (HEA) was put into a reactor equipped with a cooling system so as to achieve reflux of a nitrogen gas and ease of temperature control.

Subsequently, 400 pm of n-DDM (n-dodecyl mercaptan) as a chain transfer agent (CTA) and 100 g of ethyl acetate (EAc) as a solvent based on 100 g of the monomer mixture were added thereto, and sufficiently mixed with each other at 30° C. for 30 minutes or more while injecting nitrogen in order to remove oxygen in the reactor.

Then, the temperature was increased to and maintained at 62° C., and V-60 (azobisisobutyronitrile) at 300 ppm as a reaction initiator was added thereto to thereby initiate the reaction, followed by polymerization for 6 hours to prepare a primary reaction material.

24 g of 2-methacyloxyethyl isocyanate (MOI) (90 mol % based on HEA in the primary reaction material) and 0.24 g of a catalyst (DBTDL: dibutyltin dilaurate) were mixed in the primary reaction material, and reacted at 40° C. for 24 hours to introduce an ultraviolet curing group into the side chain of the polymer in the primary reaction material, thereby preparing a (meth)acrylate-based binder resin (a-1).

4 g of a TDI-based isocyanate curing agent and 2 g of bis(2,4,6-trimethylbenzoyl)-phenyl-phosphine oxide as a photoinitiator were mixed with 100 g of the (meth)acrylate-based binder resin (a-1), thereby preparing a composition (A-1) for forming an adhesive layer.

Preparation Example 2

A monomer mixture consisting of 20 g of ethyl acrylate, 63 g of 2-ethylhexyl acrylate (2-EHA), 2 g of 4-benzoylphenyl acrylate, and 15 g of hydroxyethyl acrylate (HEA) was put into a reactor equipped with a cooling system so as to achieve reflux of a nitrogen gas and ease of temperature control.

Subsequently, 400 pm of n-DDM (n-dodecyl mercaptan) as a chain transfer agent (CTA) and 100 g of ethyl acetate (EAc) as a solvent based on 100 g of the monomer mixture were added thereto, and sufficiently mixed with each other at 30° C. for 30 minutes or more while injecting nitrogen in order to remove oxygen in the reactor.

Then, the temperature was increased to and maintained at 62° C., and V-60 (azobisisobutyronitrile) at 300 ppm as a reaction initiator was added thereto to thereby initiate the reaction, followed by polymerization for 6 hours to prepare a primary reaction material.

15 g of 2-methacyloxyethyl isocyanate (MOI) (76 mol % based on HEA in the primary reaction material) and 0.15 g of a catalyst (DBTDL: dibutyltin dilaurate) were mixed in the primary reaction material, and reacted at 40° C. for 24 hours to introduce an ultraviolet curing group into the side chain of the polymer in the primary reaction material, thereby preparing a (meth)acrylate-based binder resin (a-2).

5 g of a TDI-based isocyanate curing agent and 3 g of bis(2,4,6-trimethylbenzoyl)-phenyl-phosphine oxide as a photoinitiator were mixed with 100 g of the (meth)acrylate-based binder resin (a-2), thereby preparing a composition (A-2) for forming an adhesive layer.

Preparation Example 3

4 g of a TDI-based isocyanate curing agent and 3 g of 2,2-dimethoxy-1,2-diphenylethane-1-one as a photoinitiator were mixed with 100 g of the (meth)acrylate-based binder resin (a-1) of Preparation Example 1, thereby preparing a composition (A-3) for forming an adhesive layer.

Comparative Preparation Example 1

A monomer mixture consisting of 80 g of 2-ethylhexyl acrylate (2-EHA), and 20 g of hydroxyethyl acrylate (HEA) was put into a reactor equipped with a cooling system so as to achieve reflux of a nitrogen gas and ease of temperature control.

Subsequently, 400 pm of n-DDM (n-dodecyl mercaptan) as a chain transfer agent (CTA) and 100 g of ethyl acetate (EAc) as a solvent based on 100 g of the monomer mixture were added thereto, and sufficiently mixed with each other at 30° C. for 30 minutes or more while injecting nitrogen in order to remove oxygen in the reactor.

Then, the temperature was increased to and maintained at 62° C., and V-60 (azobisisobutyronitrile) at 300 ppm as a reaction initiator was added thereto to thereby initiate the reaction, followed polymerization for 6 hours to prepare a primary reaction material.

24 g of 2-methacyloxyethyl isocyanate (MOI) (90 mol % based on HEA in the primary reaction material) and 0.24 g of a catalyst (DBTDL: dibutyltin dilaurate) were mixed in the primary reaction material, and reacted at 40° C. for 24 hours to introduce an ultraviolet curing group into the side chain of the polymer in the primary reaction material, thereby preparing a (meth)acrylate-based binder resin (b-1).

4 g of a TDI-based isocyanate curing agent and 2 g of bis(2,4,6-trimethylbenzoyl)-phenyl-phosphine oxide as a photoinitiator were mixed with 100 g of the (meth)acrylate-based binder resin (b-1), thereby preparing a composition (B-1) for forming an adhesive layer.

Comparative Preparation Example 2

4 g of a TDI-based isocyanate curing agent was mixed with 100 g of the (meth)acrylate-based binder resin (a-1) of Preparation Example 1, thereby preparing a composition (B-2) for forming an adhesive layer.

EXAMPLES AND COMPARATIVE EXAMPLES

Example 1

The composition (A-1) for forming an adhesive layer of Preparation Example 1 was coated onto a release-treated polyethylene terephthalate film (38 μm thick) and then dried at 110° C. for 3 minutes to form an adhesive layer having a thickness of about 30 μm.

The formed adhesive layer was laminated onto a 100 μm-thick substrate film, a polypropylene film, and then subjected to aging to obtain an adhesive sheet for temporary attachment.

Examples 2-3 and Comparative Examples 1-2

The adhesive sheet for temporary attachment was prepared in the same manner as in Example 1, except that the components and use amounts shown in the following Table 1 were applied.

The elongation (%) of the substrate film was the elongation in the MD (machine direction) when the specimen having a width of 5 mm and a length of 40 mm was stretched at a rate of 300 mm/min at 23° C.

TABLE 1

| Category | Substrate film (elongation (%)) | Adhesive layer |
| --- | --- | --- |
| Example 1 | Polypropylene (420) | Preparation Example 1(A-1) |
| Example 2 | Polybutylene terephthalate (792) | Preparation Example 2(A-2) |
| Example 3 | Polypropylene (420) | Preparation Example 3(A-3) |
| Comparative Example 1 | Polypropylene (420) | Comparative Preparation Example 1(B-1) |
| Comparative Example 2 | Polypropylene (420) | Comparative Preparation Example 2(B-2) |
| Comparative Example 3 | Polyethylene naphthalate (126) | Preparation Example 1(A-1) |

Experiment 1: Evaluation of Adhesive Strength and Peel Strength

For the adhesive sheets for temporary attachment prepared according to the examples and comparative examples, the adhesive strength and the peel strength due to photocuring were evaluated by the following method, and the results are shown in Table 2 below.

The adhesive sheets for temporary attachment prepared in the examples and comparative examples were cut to a width of 25 mm, and then a sample adhered to a silicon wafer using a 2 kg roller was prepared.

Subsequently, a heat-treated sample was prepared, which was left on a hot plate at 100° C. for 3 hours so as to make contact with the substrate surface of the adhesive sheet for temporary attachment adhered to the silicon wafer.

(1) Evaluation of Adhesion Property

The adhesion strength (gf/25 mm) of the adhesive sheet was measured at a speed of 300 mm/min and an angle of 180 degrees using a Texture Analyzer manufactured by Stable Micro Systems.

(2) Evaluation of Peeling Property

The non-heat treated sample and the heat treated sample prepared as above were subjected to ultraviolet irradiation under the conditions of intensity of 300 mJ/cm$^2$ (using a mercury lamp with a composite wavelength of 200 nm to 500 nm) on the substrate film side. The irradiated sample and the non-irradiated sample were tested for their properties, and the obtained results were evaluated.

In addition, the adhesive strength ratio (R) was measured by the following general formula through the above measured adhesive strength.

$$R(\%) = A2'*100/A1'$$ [General Formula 1]

in General Formula 1, A1' is the adhesive strength of the adhesive layer measured after heat treatment at 100° C. for 3 hours, and A2' is the adhesive strength of the adhesive layer measured after heat treatment followed by ultraviolet irradiation.

Experimental Example 2: Evaluation of Pick-Up Properties

After the release films of the adhesive sheets for temporary attachment produced according to the examples and comparative examples were peeled off, the adhesive layer surfaces were mounted at a temperature of 25° C. in a mirror wafer (8 inches, thickness of 80 μm).

Next, a heat-treated sample was prepared, which was left on a hot plate of 100° C. for 3 hours so as to make contact with the substrate film surface of the temporary attaching adhesive sheet attached to the silicon wafer.

A dicing process was performed on the heat-treated sample under the following conditions so as to have a chip size of 10 mm×10 mm.

Subsequently, the diced sample was irradiated by ultraviolet light having an intensity of 300 mJ/cm$^2$ from the substrate surface to prepare samples for measuring pick-up properties.

The prepared samples were picked up under the following conditions by using SPA-400 (SHINKAWA) equipment, and the success rate thereof was measured ass shown in Table 2 below.

—Dicing Conditions—
Device: DFD-650 (DISCO)
Blade type: 27HEBB (DISCO)
Cutting blade height (cut depth): 80 um Dicing speed: 50 mm/s
Rotation speed of blade: 40,000 rpm
—Pick-Up Conditions—
Device: SPA-400 (SHINKAWA)
Expanding height: 3 mm
Number of Needles: 10
Needle plunge height: 0.2 mm
Needle plunge speed: 10 mm/s

TABLE 2

| Category | R (%) | Adhesive strength(gf/25 mm) evaluation (after heat treatment) Before light irradiation | Adhesive strength(gf/25 mm) evaluation (after heat treatment) After light irradiation | Pick-up success rate (%) |
|---|---|---|---|---|
| Example 1 | 6.63 | 208 | 13.8 | 100 |
| Example 2 | 7.92 | 331 | 26.2 | 100 |
| Example 3 | 5.10 | 298 | 15.2 | 100 |
| Comparative Example 1 | 69.44 | 180 | 125 | 5 |
| Comparative Example 2 | 40.16 | 254 | 102 | 13 |
| Comparative Example 3 | 15.81 | 203 | 32.1 | 0 |

It is confirmed from Table 2 above that the adhesive sheets for temporary attachment prepared according to the present disclosure had an adhesive strength ratio (R) of less than 30% even after the heat treatment, so that the adhesive sheet had a large reduction in adhesion strength and could be removed without residual adhesive.

In contrast, in Comparative Examples 1 and 2, the adhesive strength ratio R after the heat process was 30% or more and the adhesive strength was high, so that the occurrence of the adhesive residue and the success rate of the pickup were insufficient.

It was confirmed that in Comparative Example 3, not only did it have a low rate of change in adhesive strength, but also the stretching property of the substrate film was insufficient and thus the pickup process was impossible.

DESCRIPTION OF SIGNS

10: adhesive sheet for temporary attachment
100: substrate film
200: adhesive layer
300: release film

The invention claimed is:

1. An adhesive sheet for temporary attachment, comprising:
 a substrate film having an elongation in the machine direction (MD) of 200% or more when stretched at a rate of 300 mm/min at 23° C.; and
 an adhesive layer containing a binder resin having a photoreactive functional group, a photoinitiator having activity at a wavelength of at least 300 nm, and a multifunctional crosslinking agent,
 wherein the adhesive layer is formed on one surface of the substrate film,
 wherein the binder resin includes a first (meth)acrylate-based repeating unit containing a benzoylphenyl group and a second (meth)acrylate-based repeating unit containing at least one functional group selected from a hydroxyl group, a carboxyl group and a nitrogen-containing functional group,
 wherein 20 to 95 mol % of the second (meth)acrylate-based repeating unit includes a photopolymerizable (meth)acrylate-based side chain derived from a compound having an isocyanate group or an epoxy group,
 wherein the adhesive layer has an initial adhesive strength A1 measured after heat treating the adhesive layer at a temperature of 90° C. to 150° C. and an adhesive strength A2 measured after irradiating the heat-treated adhesive layer with ultraviolet light, wherein a ratio R of an adhesive strength A2 relative to the initial adhesive strength A1 is 30% or less, and wherein the ratio R is defined by General Formula 1: R (%)=(A2/A1)*100.

2. The adhesive sheet for temporary attachment according to claim 1,
 wherein the initial adhesive strength A1 is measured after heat treating the adhesive layer at a temperature 100° C. for 3 hours, and
 the adhesive strength A2 is measured after irradiating the heat-treated adhesive layer with ultraviolet light in a wavelength region of 200 nm to 500 nm at a dose of 100 mJ/cm$^2$ to 1000 mJ/cm$^2$.

3. The adhesive sheet for temporary attachment according to claim 1, wherein the substrate film has a transmittance of at least 50% at a wavelength of at least 300 nm.

4. The adhesive sheet for temporary attachment according to claim 1, wherein the substrate film includes at least one polymer compound selected from a polyolefin, a polyester, a polycarbonate, a polyvinyl chloride, a polytetrafluoroethylene, a polybutene, a polybutadiene, an ethylene-vinyl acetate copolymer, an ethylene-propylene copolymer, an ethylene-alkyl acrylate copolymer and a polybutylene terephthalate.

5. The adhesive sheet for temporary attachment according to claim 1, wherein the photoinitiator is at least one material compound selected from bis(2,4,6-trimethylbenzoyl)-phenylphosphine oxide, 1-hydroxy-cyclohexyl-phenyl-ketone 2,2-dimethoxy-1,2-diphenylethan-1-one, 2-methyl-1-4-(methylthio)phenyl]-2-morpholinopropane-1-one, oxy-phenyl-acetic acid 2-[2-oxo-2-phenyl-acetoxy-ethoxy]-ethylester, oxy-phenyl-acetic acid 2-[2-hydroxy-ethoxy]-ethylester, 2-benzyl-2-dimethylamino-1-(4-morpholinophenyl)-butan-1-one, 2,4,6-trimethylbenzoyl-diphenyl-phosphine oxide, and thioxanthone.

6. The adhesive sheet for temporary attachment according to claim 1, wherein the adhesive sheet is for a protective film for a semiconductor process, a carrier film, or a film for a pickup process.

7. The adhesive sheet for temporary attachment according to claim 1, further comprising a release film on one surface of the adhesive layer on which the substrate film is not formed.

8. The adhesive sheet for temporary attachment according to claim 1, wherein
 the adhesive sheet further comprises a release film formed on one surface of the adhesive layer on which the substrate film is not formed.

9. The adhesive sheet for temporary attachment according to claim 1, wherein
 the adhesive layer is formed of two layers, each formed on respective surfaces of the substrate film, and
 the adhesive sheet further comprises a release film on the surface of the adhesive layer on which the substrate film is not formed.

* * * * *